United States Patent
Chan et al.

(10) Patent No.: US 9,935,640 B1
(45) Date of Patent: Apr. 3, 2018

(54) GAIN CALIBRATION FOR DIRECT MODULATION SYNTHESIZER USING A LOOK-UP TABLE SEARCHED BY A REDUCED COUNT FROM AN OVERFLOW COUNTER

(71) Applicant: Hong Kong Applied Science and Technology Research Institute Company, Limited, Hong Kong (HK)

(72) Inventors: Tat Fu Chan, Hong Kong (HK); Shiyuan Zheng, Hong Kong (HK); Yunlong Li, Hong Kong (HK); Wang Chi Cheng, Hong Kong (HK)

(73) Assignee: Hong Kong Applied Science and Technology Research Institute Company, Limited, Hong Kong (HK)

( * ) Notice: Subject to any disclaimer, the term of this patent is extended or adjusted under 35 U.S.C. 154(b) by 0 days.

(21) Appl. No.: 15/427,312

(22) Filed: Feb. 8, 2017

(51) Int. Cl.
| | |
|---|---|
| *H03L 7/00* | (2006.01) |
| *H03L 7/197* | (2006.01) |
| *H03L 7/099* | (2006.01) |
| *H03L 7/089* | (2006.01) |
| *H03L 7/093* | (2006.01) |

(52) U.S. Cl.
CPC .......... *H03L 7/1974* (2013.01); *H03L 7/0891* (2013.01); *H03L 7/093* (2013.01); *H03L 7/099* (2013.01)

(58) Field of Classification Search
CPC ....... H03L 7/093; H03L 7/099; H03L 7/1976; H03L 7/00; H03L 7/1974; H03L 7/089; H03L 5/14; H03L 7/24; H03L 3/01
USPC ........ 327/156, 158, 161; 375/371, 375, 376; 331/15, 16
See application file for complete search history.

(56) References Cited

U.S. PATENT DOCUMENTS

| | | |
|---|---|---|
| 6,515,553 B1 | 2/2003 | Filiol et al. |
| 6,834,183 B2 | 12/2004 | Black et al. |
| 7,015,738 B1 | 3/2006 | Cao |

(Continued)

FOREIGN PATENT DOCUMENTS

| | | |
|---|---|---|
| GB | 2466283 A | 6/2010 |

OTHER PUBLICATIONS

ISR and Written Opinion, PCT/CN2017/073709, dated Sep. 27, 2017, 12pp.

*Primary Examiner* — John Poos
(74) *Attorney, Agent, or Firm* — Stuart T. Auvinen; g Patent LLC (57) ABSTRACT

A two-point modulation Phase-Locked Loop (PLL) has a gain-adjustable voltage-controlled oscillator (VCO). A digital data modulation signal is combined with a carrier and input to a feedback divider. The data modulation signal is also input to a Digital-to-Analog Converter (DAC) to generate an analog voltage to a second input of the VCO. A calibration unit divides the VCO output and counts pulses. During calibration, the data modulation signal is set to minimum and then maximum values and VCO output pulses counted. A count difference for the data modulation signal at maximum and minimum values is input to a Look-Up Table (LUT) to read out a gain calibration value. During normal operation mode, the gain calibration value from the LUT is applied to a second input of the DAC, which drives the VCO to adjust VCO gain. A switch before the VCO opens the loop for faster open-loop calibration.

20 Claims, 7 Drawing Sheets

(56) References Cited

U.S. PATENT DOCUMENTS

| | | |
|---|---|---|
| 7,375,595 B2 | 5/2008 | Serrano et al. |
| 7,474,159 B2 | 1/2009 | Wang et al. |
| 7,755,439 B2 | 7/2010 | Yu et al. |
| 8,022,782 B2 | 9/2011 | Ahn |
| 8,154,351 B2 | 4/2012 | Tadjpour |
| 2010/0066459 A1* | 3/2010 | Ahn .................. H03C 3/0925 332/128 |
| 2010/0090768 A1* | 4/2010 | Yamazaki ............ H03L 7/099 331/15 |
| 2011/0057696 A1* | 3/2011 | Hsieh .................. H03L 7/087 327/157 |
| 2013/0015892 A1 | 1/2013 | Badets et al. |
| 2016/0036485 A1* | 2/2016 | Nagaso ................ H03L 7/183 455/76 |

\* cited by examiner

PRIOR ART

FIG. 3

GAIN LOOK-UP TABLE 64'

| FREQ DIF (MHz) | CNT DIF 2X(1.024 MS) | GAIN | 500 KHz FREQ. DEV. DACREF (6:0) |
|---|---|---|---|
| 0.94 | 120 | 14648 | 34 |
| 0.95 | 121 | 14771 | 33 |
| 1.00 | 128 | 15625 | 32 |
| 1.01 | 129 | 15747 | 31 |
| 1.02 | 130 | 15869 | 31 |
| 1.02 | 131 | 15991 | 31 |
| 1.03 | 132 | 16113 | 31 |
| 1.04 | 133 | 16235 | 30 |
| 1.05 | 134 | 16357 | 30 |
| 1.05 | 135 | 16479 | 30 |
| 1.06 | 136 | 16602 | 30 |
| 1.07 | 137 | 16724 | 29 |
| 1.08 | 138 | 16846 | 29 |
| 1.09 | 139 | 16967 | 29 |
| 1.09 | 140 | 17090 | 29 |
| 1.10 | 141 | 17212 | 29 |
| 1.11 | 142 | 17334 | 28 |
| 1.12 | 143 | 17456 | 28 |

FIG. 4

GAIN LOOK-UP TABLE

64"

| FREQ DIF (MHz) | CNT DIF 2X(1.024 MS) | GAIN | 500 KHz FREQ. DEV. DACREF (6:0) |
|---|---|---|---|
| 0.78 | 102 | 12451 | 40 |
| 0.81 | 103 | 12573 | 39 |
| 0.81 | 104 | 12695 | 39 |
| ... | | | |
| 1.02 | 131 | 15991 | 31 |
| 1.03 | 132 | 16113 | 31 |
| 1.04 | 133 | 16235 | 30 |
| 1.05 | 134 | 16357 | 30 |
| 1.05 | 135 | 16479 | 30 |
| ... | | | |
| 1.17 | 150 | 18311 | 27 |
| 1.18 | 151 | 18433 | 27 |
| 1.19 | 152 | 18555 | 26 |
| 1.20 | 153 | 18677 | 26 |
| 1.20 | 154 | 18799 | 26 |
| 1.21 | 155 | 18921 | 26 |

FIG. 5

GAIN LOOK-UP TABLE 64

FIG. 6

| CNT DIF 2X(1.024 MS) | 500 KHz FREQ. DEV. DACREF (6:0) |
|---|---|
| 102 | 40 |
| 103 | 39 |
| 104 | 39 |
| ... | ... |
| 131 | 31 |
| 132 | 31 |
| 133 | 30 |
| 134 | 30 |
| 135 | 30 |
| ... | ... |
| 150 | 27 |
| 151 | 27 |
| 152 | 26 |
| 153 | 26 |
| 154 | 26 |
| 155 | 26 |

FIG. 7

GAIN CALIBRATION FOR DIRECT MODULATION SYNTHESIZER USING A LOOK-UP TABLE SEARCHED BY A REDUCED COUNT FROM AN OVERFLOW COUNTER

FIELD OF THE INVENTION

This invention relates to Phase-Locked Loops (PLL's), and more particularly to gain calibration of a Voltage-Controlled Oscillator (VCO) in a two-point-modulation PLL.

BACKGROUND OF THE INVENTION

Wireless communication systems often require precise clocks that may be modulated to carry data. A clock may be generated using a Phase-Locked Loop (PLL) that has a voltage-controlled oscillator (VCO) that converts an input voltage to an output clock with a frequency that depends on the input voltage.

Some communication standards employ high frequencies and may hop from one frequency channel to another to avoid interference or other impediments to transmission. The VCO may thus be required to operate over a wide range of frequencies, and require a large gain. Large VCO gains often require a large chip area and thus a higher cost of manufacture and power.

A PLL can be used to generate a clock, and then data can be mixed with the clock after the PLL output, such as by an up-conversion mixer and a Digital-to-Analog Converter (DAC). The DAC can introduce mismatches for both in-phase and quadrature signals (IQ mismatch). The chip area required for the DAC and mixer increases the cost and power requirements.

A two-point modulation PLL may also be used. Data is injected into the PLL itself so that the PLL outputs a data-modulated output rather than a fixed clock. The up-conversion mixer and its DAC are no longer required when a two-point modulation PLL is used. The two-point modulation PLL also can enhance noise performance. The pulling effect from a power amplifier to the VCO can be alleviated.

Figure 1:
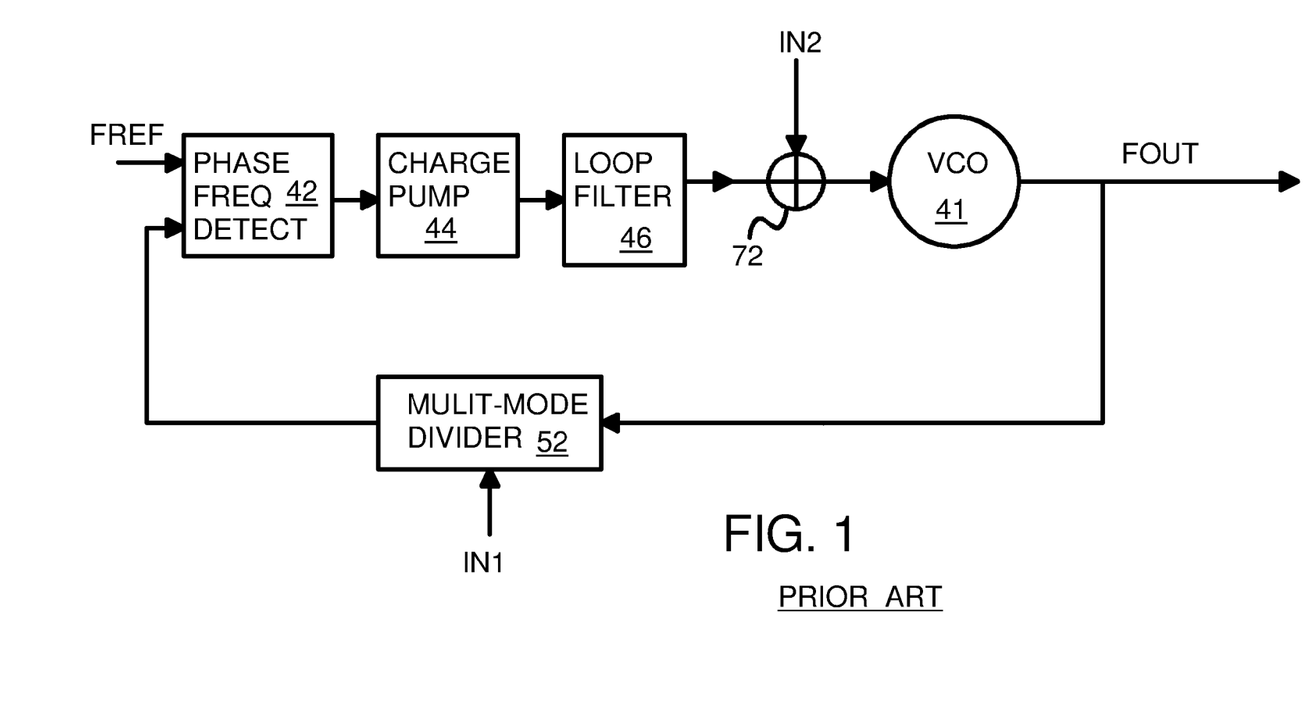
FIG. 1 shows a prior-art two-point modulation PLL.

FIG. 1 shows a prior-art two-point modulation PLL. A Phase-Locked Loop (PLL) is formed by phase-frequency detector 42, charge pump 44, loop filter 46, adder 72, VCO 41, and multi-mode divider 52. The output clock FOUT from VCO 41 is divided by multi-mode divider 52 and compared to a reference clock FREF by phase-frequency detector 42. The comparison result causes charge pump 44 to charge or discharge loop filter 46, which adjusts the input voltage to VCO 41. VCO 41 responds to changes in its input voltage by adjusting the frequency of output clock FOUT.

Data is used to modulate or encode FOUT from VCO 41. Data is injected into the PLL at two points. Data IN1 is applied to multi-mode divider 52, while data IN2 is input to adder 72. The same data values are applied to IN1 and IN2, but IN1 may be a digital representation of the data while IN2 may be an analog voltage that represents the same data. IN1 causes multi-mode divider 52 to modulate its divisor, while IN2 directly adjusts the input voltage to VCO 41. Since IN2 is applied at the input of VCO 41, it has a high-pass characteristic, while IN1 is applied earlier in the PLL loop and has a low-pass characteristic. Modulations of the divisor in multi-mode divider 52 introduced by IN1 must pass through phase-frequency detector 42, charge pump 44, and loop filter 46 before reaching adder 72 where IN2 is injected, so IN1 has a greater inherent delay than does IN2.

Figure 2A:
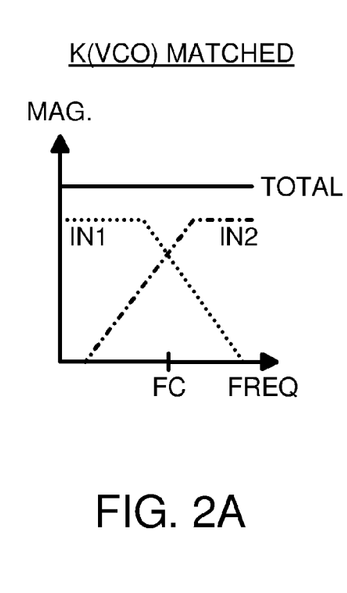
FIGS. 2A-C show frequency response graphs that highlight gain mismatching in a two-point modulation PLL.
Figure 2B:
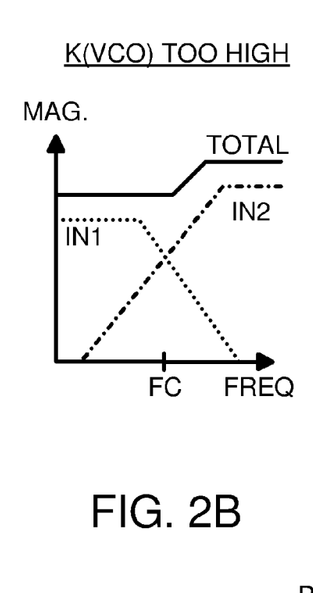
Figure 2C:
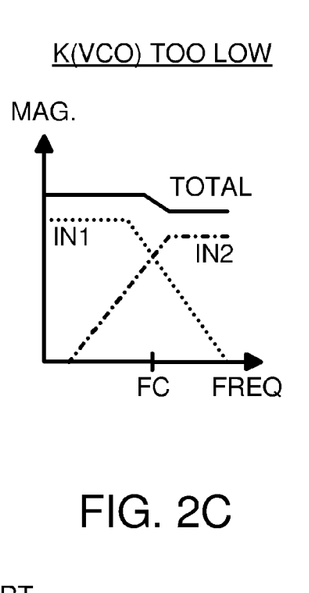

FIGS. 2A-C show frequency response graphs that highlight gain mismatching in a two-point modulation PLL. Since IN2 does not pass through phase-frequency detector 42, charge pump 44, and loop filter 46, its frequency response is dominated by the gain of VCO 41.

FIG. 2A shows a graph for a well-matched two-point modulation PLL. The frequency response of IN1 drops off at higher frequencies due to the delays in multi-mode divider 52, phase-frequency detector 42, charge pump 44, and loop filter 46. These delays are not present for IN2, which has a very good response at high frequencies but less at low frequencies. Thus IN1 resembles a low-pass filter, while IN2 resembles a high-pass filter.

Since the same data is passed through both IN1 and IN2, the total frequency response is the sum of the frequency response curves of IN1 and IN2. This total response is relatively flat over all frequencies when gain is well-matched, as shown in FIG. 2A.

In FIG. 2B, the VCO gain, $K_{VCO}$, is too high. The high gain of VCO 41 strongly impacts the high-frequency response of IN2, while IN1 remains about the same since multi-mode divider 52, phase-frequency detector 42, charge pump 44, and loop filter 46 are not altered by the change in gain of VCO 41. The total frequency response, which is the sum of IN1 and IN2's frequency response curves, rises after cross-over frequency FC. The jump in the total response curve at high frequencies can cause signal distortion.

In FIG. 2C, the VCO gain, $K_{VCO}$, is too low. The low gain of VCO 41 reduces the high-frequency response of IN2, while IN1 remains about the same. The total frequency response drops off after cross-over frequency FC, since high-frequency response is dominated by data injected through IN2 and VCO 41.

The gain of VCO 41 is process-dependent, and varies from chip to chip. Process, power-supply Voltage, and Temperature (PVT) variations can strongly influence VCO gain and thus frequency response, resulting in signal distortion. During design, the circuit can be designed so that the low-frequency response of IN1 matches the high-frequency response of IN2 at the typical PVT condition.

Gain calibration is often used to adjust for PVT conditions, and to better match high and low frequency responses of a two-point modulation PLL. With good calibration of the gain of VCO 41, the low-frequency response of IN1 can fairly well match the high-frequency response of IN2 over a range of PVT conditions.

Sometimes large-area circuits are used for calibration, such as ADC's, analog comparators, and double-loop filters. High-frequency counters may be used, but these consume high power at the high frequencies they operate at. A single-input VCO has limitations on linearity and tuning range. Calibration units often use multipliers and dividers, which are large, complex circuits. Large circuits have a large die area, increasing cost and power consumption and are thus undesirable. Precision circuits such as analog comparators and ADC's may require large components to achieve a target precision.

As the system warms up, PVT may continue to vary, forcing re-calibration and more delays. Some systems are closed loop, where the PLL loop filter remains connected to the VCO input during calibration. This is undesirable due to the extra settling time for the loop. Open loop systems disconnect the PLL loop filter from the VCO input during calibration, resulting in faster calibration times.

What is desired is a two-point modulation PLL with an open-loop calibration system. A calibration system that does not use precision analog comparators is desirable. An all-digital calibration unit is desired for a two-point modulation PLL. A two-point modulation PLL that uses a two-input VCO is desirable to break the tradeoff between linearity and tuning range. A calibration unit that does not use multipliers and dividers is desired. A low-power and low area calibration unit is desired.

DETAILED DESCRIPTION

The present invention relates to an improvement in gain calibration for multi-point-modulation PLL's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
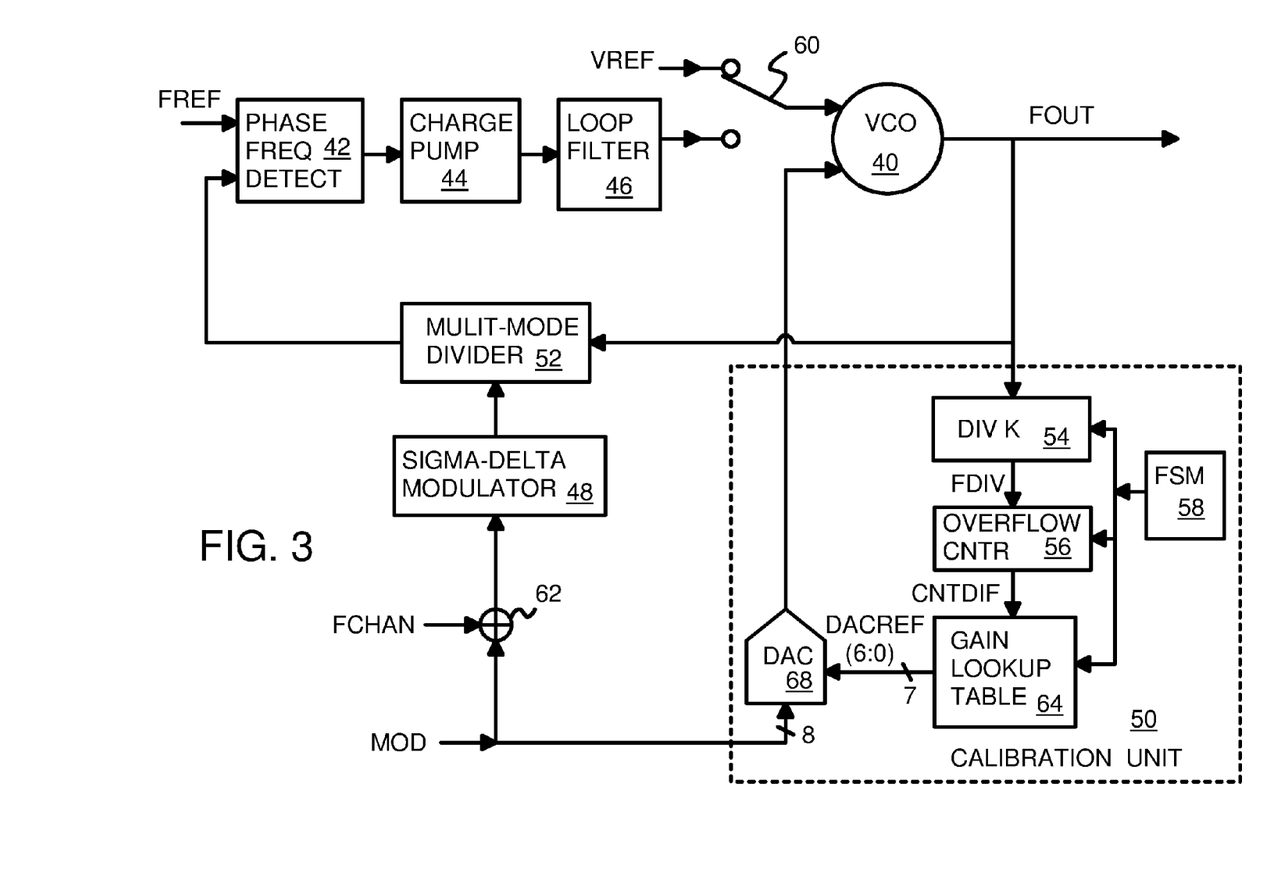
FIG. 3 is block diagram of a two-point modulation PLL using an overflow counter and a Look-Up Table (LUT) to calibrate VCO gain.

FIG. 3 is block diagram of a two-point modulation PLL using an overflow counter and a Look-Up Table (LUT) to calibrate VCO gain. Rather than use multipliers and dividers to convert frequency differences to calibration values, the inventors use a Look-Up Table (LUT). Rather than use analog comparators, during calibration overflow counter 56 counts pulses of VCO output FOUT. To reduce power consumption, FOUT is first divided by K by divider 54 before overflow counter 56 is clocked. The difference in pulse counts for a given period of time (CNTDIF) is input to gain LUT 64, which then outputs a digital value DACREF (6:0). DACREF(6:0) is the gain control for DAC 68. DAC 68 converts digital data MOD to an analog signal that is applied to the gain-control input of VCO 40. Calibration unit 50 also includes a controller such as Finite State Machine (FSM) 58 to control calibration operations.

A Phase-Locked Loop (PLL) is formed by phase-frequency detector 42, charge pump 44, loop filter 46, switch 60, VCO 40, and multi-mode divider 52. The output clock FOUT from VCO 40 is divided by multi-mode divider 52 and compared to a reference clock FREF by phase-frequency detector 42. The comparison result causes charge pump 44 to charge or discharge loop filter 46, which adjusts the input voltage to VCO 40. VCO 40 responds to changes in its input voltage by adjusting the frequency of output clock FOUT.

The specified frequency FCS that the transceiver is using is indicated by FCHAN. FCHAN can be a carrier wave for the specified frequency FCS that is applied to adder 62 to be modulated by MOD and then the modulated carrier is applied to sigma-delta modulator 48. Sigma-delta modulator 48 generates a signal that dithers the divisor used by multi-mode divider 52 so that fractional divisor values may be achieved although multi-mode divider 52 is using integer divisors. Integer divisors such as N and N+1 can be averaged over several cycles to achieve a desired fractional divisor, and allow a more arbitrary value of FOUT to be generate from FREF. The PLL loop smoothes out the resulting variations as two integer divisor values are alternated by sigma-delta modulator 48 and multi-mode divider 52.

When a new frequency is specified, FCHAN changes to the new frequency's carrier and may cause multi-mode divider 52 to change its divisors, and sigma-delta modulator 48 to change its dithering periods.

Two-point modulation is provided by modulation data MOD, which is injected into the PLL loop at two points, multi-mode divider 52 and VCO 40. An 8-bit modulation value MOD is added to the frequency carrier wave FCHAN by adder 62, and then dithered by Sigma-delta modulator 48 and injected into the loop by multi-mode divider 52.

The 8-bit data MOD is also converted to an analog voltage by DAC 68 and input to the gain-control input of VCO 40. The gain-control input of VCO 40 can adjust a delay element such as a variable capacitor on an internal node in VCO 40, or can adjust a power-supply voltage for internal stages within VCO 40. The gain-control input to VCO 40 has a lower gain and better linearity while the loop input from loop filter 46 and switch 60 to VCO 40 has a higher gain but worse linearity.

DAC 68 has an 8-bit data input that receives modulated digital data MOD, and a 7-bit gain input that receives DACREF(6:0) from gain LUT 64. The gain input of DAC 68 scales the output voltage of DAC 68. DACREF(6:0) thus defines the maximum swings of the output voltage of DAC 68. The 8-bit data input that receives MOD is converted from digital to an analog voltage, while the gain input scales the analog voltage.

During calibration, switch 60 connects the voltage input to VCO 40 to reference voltage VREF. The connection from loop filter 46 is broken by switch 60 during calibration mode. Thus calibration is performed in an open-loop configuration. The open-loop configuration is desirable since calibration settling time does not depend on long delays through the entire PLL loop.

Calibration unit 50 measures the frequency of FOUT by counting pulses. Divider 54 divides FOUT by K, where K is a real number of at least 1. The divided-by-K output of divider 54 is slower than FOUT, allowing overflow counter 56 to operate more slowly and with less power. An all-digital counter has a lower area, power consumption, and cost than an analog comparator, and is less susceptible to process variations.

Finite State Machine (FSM) 58 controls the sequence of operations during calibration mode. During calibration, FSM 58 initially sets DACREF to a middle value such as 1000000. Then FSM 58 causes MOD to be set high to 1111 1111, (MOD=FF), which passes through DAC 68 to control the gain of VCO 40. FSM 58 reads the count value from overflow counter 56 after a 1.024 millisecond (ms) period has elapsed, and stores this value. Then FSM 58 causes MOD to be set low to 0000 0000, (MOD=00), which again passes through DAC 68 to control the gain of VCO 40. FSM 58 reads the count value from overflow counter 56 after a 1.024 ms period has elapsed, and stores this value. The difference in the MOD=FF and MOD=00 counts is CNTDIF. FSM 58 inputs CNTDIF to gain LUT 64.

Gain LUT 64 converts the count difference for the 1.024 ms period directly into the gain adjustment value DACREF (6:0). No multiplier or divider or arithmetic-logic-unit (ALU) is needed. Calibration unit 50 generated a gain adjustment value to apply to VCO 40 by measuring pulses of the VCO output FOUT when the modulation input MOD was at its two extreme values.

The analog voltage generated from DACREF(6:0) by DAC 68 is applied to the gain input of VCO 40. Switch 60 is closed to connect loop filter 46 to VCO 40, allowing normal closed-loop PLL operation to occur. Data modulation can resume on MOD.

Gain Calibration Purpose and Overview

The two-point modulation PLL can be designed so that the low-frequency response of IN1 matches the high-frequency response of IN2 at the typical PVT condition. Then gain calibration may be added to adjust the gain of VCO 40 for current PVT conditions. In particular, a communication protocol or specification may specify what the maximum frequency deviation is for the maximum change in the modulation data MOD. For example, the maximum change in MOD is from MOD=00 to MOD=FF, and the communication protocol specified that the frequency deviation should be +/−250 kHz, or 500 kHz total. During calibration, MOD=00 is applied to VCO 40 and a pulse count taken, then MOD=FF is applied to VCO 40, and another pulse count taken. The difference in pulse counts is CNTDIF.

An adjustment or calibration value is then calculated from CNTDIF. This calibration value DACREF(6:0) is a value to be applied to DAC 68 that will adjust the frequencies for MOD=00 and MOD=FF to be exactly 1.0 MHz apart for ZigBee, for a +/−500 kHz specification, or 500 kHz apart for Bluetooth Low Energy (BLE), for a +/−250 kHz specification. Equation (3) below can be used to calculate DACREF (6:0) directly from CNTDIF, when the feedback divisor and reference frequency are pre-set.

Figure 4:
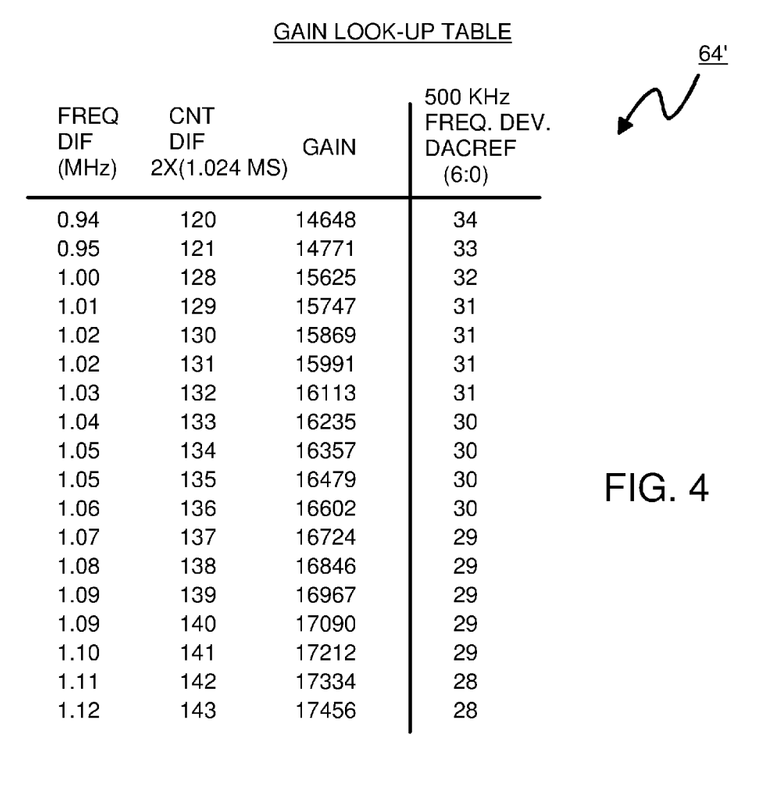
FIG. 4 shows an expanded gain LUT.

FIG. 4 shows an expanded gain LUT. The count difference measured over two 1.024 ms periods (one for Count Mod 1 and the other for Count Mod 2) is input into gain LUT 64' and a gain control value DACREF(6:0) is output. Each row in gain LUT 64' is for a different integer value of CNTDIF, which is a function of the frequency difference. Each row also has the calculated gain that is a function of that frequency difference, and the DACREF(6:0) value to cause VCO 40 to achieve that gain.

The values in gain LUT 64' are for a 500 KHz frequency deviation from MOD=00 to MOD=FF. This frequency deviation is specified by the communication standard, such as Bluetooth Low-Energy (BLE), which has a 500 KHz frequency deviation, +/−250 kHz. Values in gain LUT 64' could be recalculated for other frequency deviations, such as 1 MHz, +/−500 kHz, for the ZigBee (IEEE 802.15.4) standard.

The frequency difference between Fout1 (MOD=FF) and Fout2 (MOD=00) is:

$$Fout1-Fout2=(Fref \times K/N\text{times}) \times (\text{Count Mod 1}-\text{Count Mod 2}) \quad (1)$$

where Count Mod 1 is the pulse count in overflow counter 56 when MOD=FF, Count Mod 2 is the pulse count when MOD=00, K is the divider ratio of divider 54, Fref is the reference frequency FREF input to phase-frequency detector 42, and Ntimes is the number of FREF clock cycles.

The gain K mod of VCO 40 may be calculated as:

$$K\text{ mod}=Fout1-Fout2/(\text{Mod 1}-\text{Mod 2})$$

where Mod 1 is the initial value of DACREF
Since Mod 2=00:

$$K\text{ mod}=Fout1-Fout2/(DACREF\text{initial})$$

Substituting for Fout1−Fout2 from equation (1) above, $$K\text{ mod}=(Fref \times K/N\text{times}) \times (\text{Count Mod 1}-\text{Count Mod 2})/(DACREF\text{initial}) \quad (2)$$

After calculating the gain K mod of VCO 40, to generate an exact frequency deviation Fdev for a specified frequency deviation such as 500 KHz for the BLE standard, the gain adjustment (calibration) for DAC is made as input DACREF (6:0) (DACREF).

There are two inputs to DAC 68. One input is MOD for the modulation data input. The other input is DACREF, which is used for gain adjustment (calculated during calibration).

Since K mod=Fout1−Fout2/(DACREFinitial), for a particular frequency deviation $\Delta f$, the corresponding $DACREF_{\Delta f}=\Delta f/K$ mod $$DACREF500k=500k/K\text{ mod}$$

Substituting for K mod from equation (2) above, $$DACREF500k(6:0)=500k/[[(Fref \times K/N\text{times}) \times (\text{Count Mod 1}-\text{Count Mod 2})]/(DACREF\text{initial})] \quad (3)$$

where DACREFinitial=$2^6$=64=100 0000

DACREF500k can thus be calculated using equation (3) from the count difference (Count Mod 1−Count Mod 2), or CNTDIF, since FREF, K, and N are known inputs to the PLL.

Each row of gain LUT 64' has the count difference CNTDIF (Count Mod 1−Count Mod 2) as its address input, and also shows the frequency difference corresponding to this value of CNTDIF. The VCO gain, K mod, is calculated using equation (2), and DACREF(6:0) for 500 kHz (DACREF500k) is calculated using equation (3).

For example, when calibration unit 50 finds a count difference CNTDIF of 120, the frequency difference was 0.94 MHz. The VCO gain that corresponds to this measured frequency difference is 14,648. A value of 34 (0100010) for DACREF(6:0) is applied to DAC 68 to adjust the gain of VCO 40.

When the measured count difference is 140, DACREF(6: 0) is set to 29, or 0011101. Note that often several values of CNTDIF map to the same value of DACREF(6:0).

Ideally, at typical PVT conditions, the +/−500 kHz frequency deviation specification has a total frequency difference of 1.0 MHz. Support for both Zigbee and BLE can be achieved for FREQDIF in a typical case of 1 MHz (+/−500K Hz) for Zigbee, and for BLE, DACREF is divided by 2. The count difference should be 128 under these ideal conditions. The gain is 15625 and is obtained using a DACREF(6:0) value of 32 or 100000. This is also the initial value of DACREF(6:0) that is applied during calibration, so when ideal conditions are present, DACREF(6:0) does not have to change from its midpoint value. When PVT conditions deviate from the ideal, the measured count difference CNT-DIF will be higher or lower that the ideal 128, and DACREF (6:0) will be adjusted using the values in gain LUT 64' to add compensation through DAC 68, which will cause VCO 40 to have the target gain.

Figure 5:
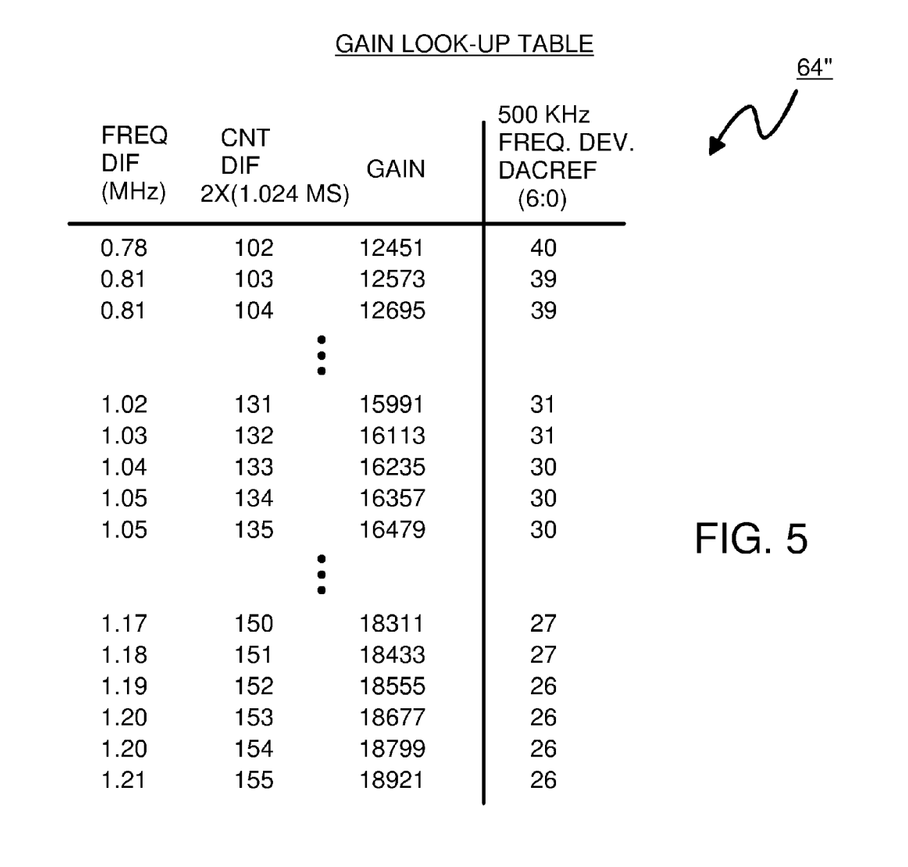
FIG. 5 is a gain LUT with a reduced number of rows.

FIG. 5 is a gain LUT with a reduced number of rows. Although Process, power-supply Voltage, and Temperature (PVT) variations occur, the two-point modulation PLL will be operated within a defined range of these conditions. For a +/−20% process variation, it is estimated that the frequency differences will range from 0.8 MHz to 1.2 MHz under power voltage and temperature conditions that the device is specified to operate with. Since frequency differences less than 0.8 MHz and more than 1.2 MHz are unlikely, data for these out-or-range conditions do not need to be stored in gain LUT 64.

Gain LUT 64" only stores data for count difference CNTDIF values from 102 to 155 that correspond to frequency differences of 0.8 MHz to 1.2 MHz. Other values of CNTDIF do not have rows of data stored, so data storage requirements are reduced. The first row has CNTDIF of 102, which is 01100110 in binary. The last row has CNTDIF of 155, which is 10011011 in binary.

For Mod 1, the counted pulse Count Mod 1=Ntimes/Fref* (Fout1/K)=312,960 for Freq=32 MHz, Ntimes=32,768 and Fout1=2.445 GHz. For Mod 2, Count Mod 2=312,832 for Fout2=2.444 GHz. To count a value up to 312,960, 19 bits are needed. However, an exact counted value is not needed. Instead, the difference between the counted value is important. Since the difference in counted values is greatly reduced, the counter size can also be reduced.

Figure 6:
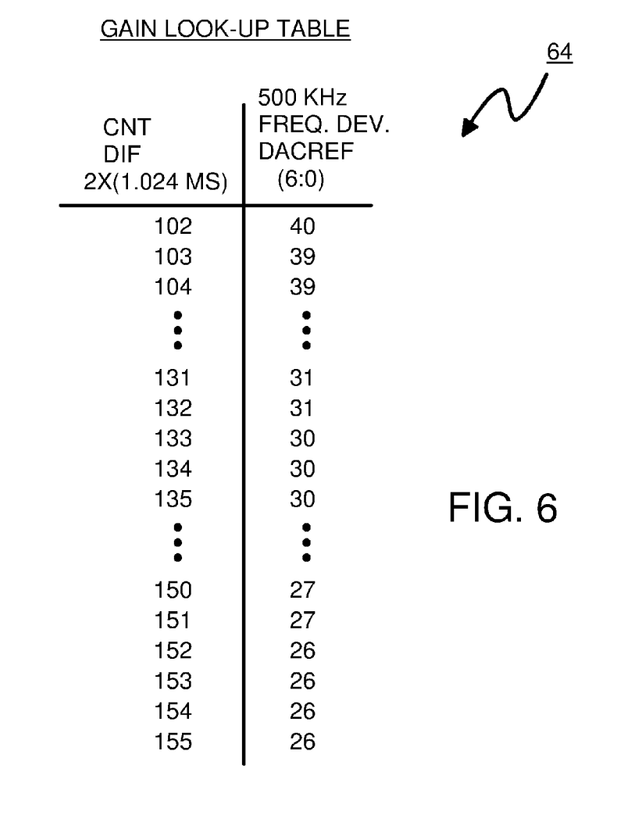
FIG. 6 is a reduced gain LUT.

FIG. 6 is a reduced gain LUT. Gain LUT 64 can be implemented as a read-only memory (ROM) that has the count difference CNTDIF input as an address, and DACREF (6:0) read as the data stored at that address. The frequency difference and gain values are not needed for circuit operation, as these are intermediate values useful in calculating the final DACREF(6:0) data stored in gain LUT 64. Thus the size of gain LUT 64 can be reduced by storing only the data used by the PLL hardware.

Each row of gain LUT 64 has the count difference CNTDIF (Count Mod 1−Count Mod 2) as its address input, and DACREF(6:0) as the data stored for that address. DACREF(6:0) for a 500 kHz specification (DACREF500k) and for a 1 MHz specification (DACREF1M) are calculated using equation (3). Values of DACREF500k and DACREF 1M are pre-calculated using equation (3) and the results loaded into gain LUT 64 during manufacture or programming.

Figure 7:
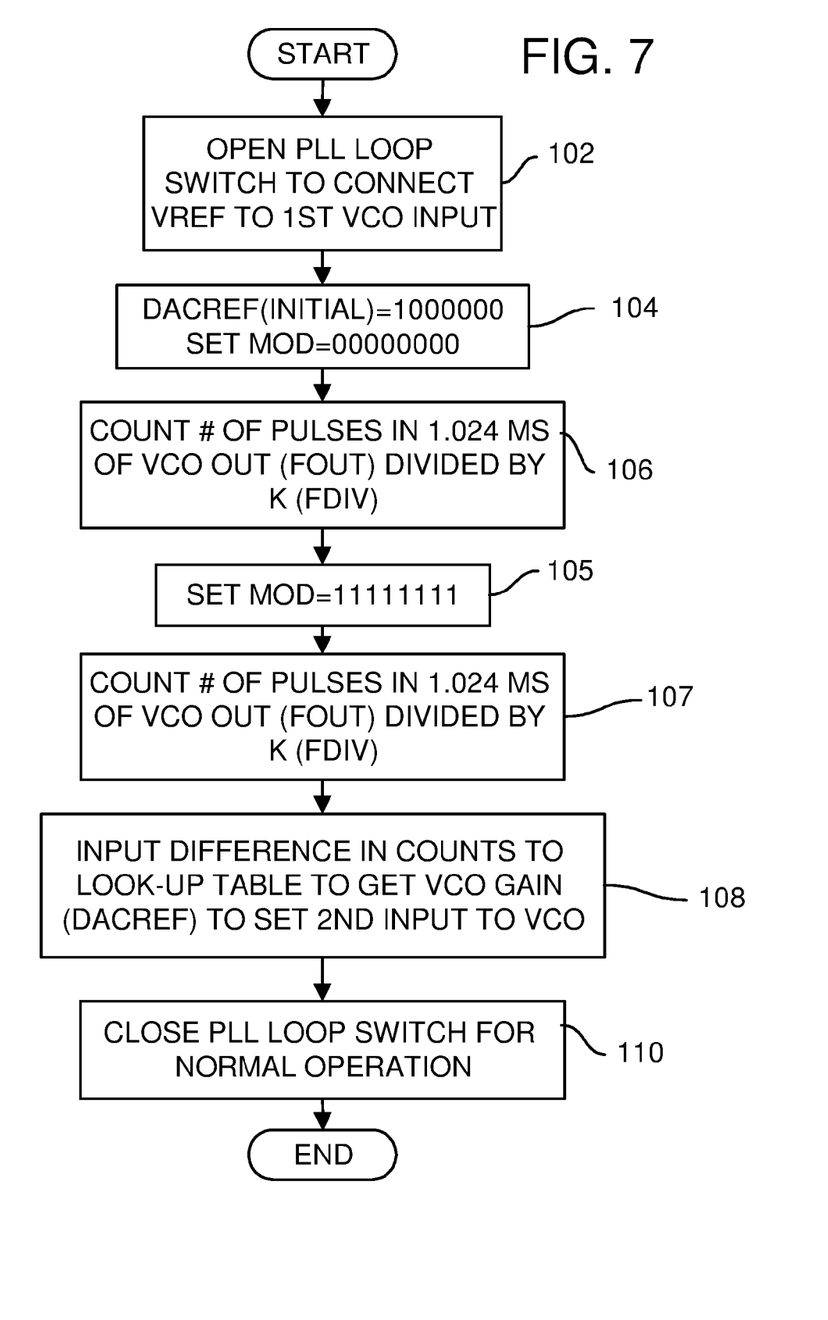
FIG. 7 is a flowchart of calibration of the two-point modulation PLL of FIG. 3 using an overflow counter and a Look-Up Table (LUT).

FIG. 7 is a flowchart of calibration of the two-point modulation PLL of FIG. 3. Switch 60 is opened to connect reference voltage VREF to the voltage input of VCO 40, opening the PLL loop, step 102.

FSM 58 sets DACREF$_{initial}$ to 1000000 and sets MOD to 0000 0000, step 104. Thus the data inputs are set to the lowest possible value. The number of pulses in a 1.024 ms period is counted by overflow counter 56 and stored, step 106. This number is first divided by K by divider 54.

FSM 58 sets MOD to 1111 1111, step 105. Thus the data inputs are set to the highest possible value. The number of pulses in a 1.024 ms period and divided by K by divider 54 is counted by overflow counter 56 and stored, step 107.

The difference between the stored counts for MOD=00 and MOD=FF is calculated as CNTDIF. CNTDIF is input to gain LUT 64 which returns the value of DACREF(6:0) stored for this count difference CNTDIF, step 108. DACREF (6:0) is applied to DAC 68 and adjusts the gain offset applied to the gain input of VCO 40.

Switch 60 disconnects VREF and applies the voltage from loop filter 46 to the input of VCO 40, step 110. Normal closed-loop operation can begin, using the curve selected by coarse and fine calibration.

Alternate Embodiments

Several other embodiments are contemplated by the inventors. For example while a multi-mode divider 52 has been shown, a normal divider may be substituted, depending on the input and output frequencies needed. Sigma-delta modulator 48 may be replaced with an integer-N divider, or may be deleted in some embodiments. Switch 60 could be implemented with MOS transistor switches.

Rather than storing the MOD=FF and MOD=00 count values, FSM 58 could store only one value and then directly calculate CNTDIF. FSM 58 could also cause overflow counter 56 to count up (or down) during MOD=FF and count down (up) during MOD=00 to directly get CNTDIF once the second count period completes.

The system may be useful for various applications and standards, such as RF sampling systems, BLE, WIFI, RFID tags, etc. The values in gain LUT 64 may be recalculated for different values of FREF, K, N, and for the maximum specified frequency deviation, such as 500 kHz, 1 MHz, etc. Multiple gain LUT 64 could be stored in a larger memory and moved to a local cache of gain LUT 64 that is used by calibration unit 50. The values in LUT 64 could be scaled for different parameters such as the maximum specified frequency deviation, etc. When the channel-selected carrier FCHAN changes, an indicator for the new frequency could select from among these copies of gain LUT 64 and swap contents of gain LUT 64 when a frequency change occurs, such as for channel hopping.

LUT 64 could be populated with values for a 1 MHz maximum frequency deviation, and these values also scaled for use with a 500 kHz frequency deviation. MOD may be limited to a smaller range than calibrated for. Calibration may be performed for the full binary range of MOD=0000 0000 and MOD=1111 1111, but during normal operation, MOD may be operated within the full range. MOD may be defined in binary or in another ordering system such as two's complement. In two's complement, the minimum MOD is 1001 1001 and the maximum MOD is 0111 1111, since the first bit is a sign bit. Two's complement values may be converted to binary before input to DAC 68. DAC 68 may have a different number of input bits and gain-calibration bits, and may have its overall resolution adjusted by the number of input bits.

For example, a wireless standard could specify several frequencies that could be used, and multiple frequencies each with a gain LUT 64 could be calibrated to allow rapid frequency hopping among these frequencies. Measurements of DACREF(6:0) from prior calibrations could remain stored when a new frequency is calibrated, allowing the transceiver to jump back to the old frequency and its old DACREF(6:0) value at a future time without requiring re-calibration.

While a variable capacitor has been described in an embodiment of a variable-gain VCO, other variable delay mechanisms could be used, such as a variable resistor, a variable filter network, muxing of delay stages, etc. The input voltage of the VCO from the loop filter could be applied to the power-supply nodes of the inverters. The number and type of inverters could be varied, and a pair of cross-coupled inverting stages, or an L-C oscillator could be used rather than three or some other odd number of inverters.

While a period of time of 1.024 ms has been shown for counting pulses for calibration, other time periods could be substituted. Shorter time periods reduce calibration time but are less accurate. A longer time period allows for more accurate measurement but lengthens calibration time.

Pulse counts could be modified, such as being shifted, divided, multiplied, or their reciprocals taken, before or after storage. The count difference could be positive or negative, and be defined as Count Mod 1−Count Mod 2 or as Count Mod 2−Count Mod 1.

Calibration could be performed multiple times per day, and triggered periodically, after a temperature change, frequency change, or by a power-up sequence.

While DACREF(6:0) values having an inverse relationship with gain have been shown, the values could be reversed and inverted, or VCO 40 could require a positive-slope gain value rather than a negative-slope gain value. The VCO or other components could be adjusted for this changed definition of values.

While FSM 58 has been shown, other kinds of sequencers or controller could be used, such as hardware, firmware, or hybrid controllers. The reference voltage VREF can be a fixed voltage such as VDD/2, or can be generated using a band-gap reference, voltage divider, or other reference generator.

Additional components may be added at various nodes, such as resistors, capacitors, inductors, transistors, buffers, etc., and parasitic components may also be present. Enabling and disabling the circuit could be accomplished with additional transistors or in other ways. Pass-gate transistors or transmission gates could be added for isolation. Inversions may be added, or extra buffering. Separate power supplies and grounds may be used for some components. Various filters could be added. Active low rather than active high signals may be substituted.

Additional components may be added at various nodes for various purposes, such as cut-off switches for power-down modes, voltage shifters, offset currents to set A.C. operating points, etc. Inverters may be replaced with differential amplifiers. Various reference voltages or virtual supplies may be used rather than a hard ground.

While binary values have been described, other encodings could be substituted, such as decimal or gray code. The digital values could be in these other number systems, such as octal numbers rather than binary numbers. Values could be complemented or inverted. The number of bits may be adjusted. Various kinds of counters such as ripple counters or synchronous counters could be substituted.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. An adjustable-gain synthesizer comprising:
   a phase detector that compares a reference clock to a feedback clock;
   a charge pump activated by the phase detector;
   a loop filter that is charged and discharged by the charge pump;
   a voltage-controlled oscillator (VCO) having a VCO voltage input that determines a frequency of a VCO output, and a gain-adjusting input that adjusts a VCO gain and modulates the frequency of the VCO output;
   a switch that connects the loop filter to the VCO voltage input during a normal mode, and disconnects the loop filter and applies a reference voltage to the VCO voltage input during a calibration mode, wherein the adjustable-gain synthesizer operates in open-loop mode during the calibration mode;
   a feedback divider that divides the VCO output by a divisor to generate the feedback clock;
   a calibration unit having a pulse counter that receives the VCO output and generates a pulse count for a time period;
   a Digital-to-Analog Converter (DAC) that receives a modulation input and a gain-calibration input, the modulation input receiving a data modulation signal, the DAC generating a signal to the gain-adjusting input of the VCO;
   a Look-Up Table that is addressed by a pulse-count difference to output a DAC reference value to apply to the gain-calibration input of the DAC; and
   a controller in the calibration unit that forces the data modulation signal to a maximum value while the pulse counter generates a first pulse count for a time period;
   the controller forcing the data modulation signal to a minimum value while the pulse counter generates a second pulse count for the time period;
   the controller sending the pulse-count difference to the Look-Up Table, wherein the pulse-count difference is generated as a difference of the first and second pulse counts;
   wherein the DAC reference value is applied to the DAC during the normal mode to adjust the gain-adjusting input of the VCO and perform gain compensation,
   whereby calibration determines the pulse-count difference which looks up the DAC reference value in the Look-Up Table to adjust the VCO gain of the VCO.

2. The adjustable-gain synthesizer of claim 1 wherein the Look-Up Table has rows that are addressed by the pulse-count difference, the rows each storing a DAC reference value for output;
   wherein division and multiplication are not performed by the calibration unit during calibration but are pre-computed into the Look-Up Table.

3. The adjustable-gain synthesizer of claim 2 wherein the Look-Up Table comprises pre-computed values of the DAC reference value as a function of the pulse-count difference, wherein the DAC reference value is:

$$SFD/[[(Fref \times K/Ntimes) \times (\text{Count Mod 1} - \text{Count Mod 2})]/(DACREFinitial)];$$

wherein SFD is a specified frequency deviation in Hertz;
Fref is a reference frequency of the reference clock in Hertz;
Ntimes is a number of cycles of Fref;
Count Mod 1−Count Mod 2 is the pulse-count difference;
DACREFinitial is an initial value of the DAC reference value; and
K is a divisor for the pulse counter that is 1 or more.

4. The adjustable-gain synthesizer of claim 3 wherein the controller applies the initial value of the DAC reference value to the DAC during calibration.

5. The adjustable-gain synthesizer of claim 4 wherein the initial value of the DAC reference value is half of a range of possible values of the DAC reference value.

6. The adjustable-gain synthesizer of claim 5 wherein the data modulation signal has at least 8 binary bits.

7. The adjustable-gain synthesizer of claim 5 wherein the DAC reference value is a binary word having at least 7 bits.

8. The adjustable-gain synthesizer of claim 3 wherein the pulse counter is an overflow counter that directly generates the pulse count difference by modifying the first pulse count as the second pulse count is being generated.

9. The adjustable-gain synthesizer of claim 3 wherein the pulse counter comprises:
a divided pulse counter;
a pre-divider that generates a pulse to the divided pulse counter after every K pulses of the VCO output, wherein K is a real number of at least 1;
whereby the VCO output is divided by K before counting.

10. The adjustable-gain synthesizer of claim 3 wherein the feedback divider is a multi-mode divider allowing for fractional divisors.

11. The adjustable-gain synthesizer of claim 10 further comprising:
a sigma-delta modulator, coupled to the feedback divider, for dithering two or more integer divisors to apply to the feedback divider.

12. The adjustable-gain synthesizer of claim 11 further comprising:
a summer, receiving the data modulation signal and a channel select signal, for generating a modulating signal to the sigma-delta modulator;
wherein data modulation is injected at the feedback divider and at the gain-adjusting input of the VCO,
wherein the adjustable-gain synthesizer is a two-point modulation Phase-Locked Loop (PLL).

13. A two-point modulation Phase-Locked Loop (PLL) comprising:
a voltage-controlled oscillator (VCO) that generates a VCO output having a frequency determined by a VCO analog input and a gain modulation input;
a feedback divider that generates a feedback clock by dividing the VCO output by a divisor, wherein the divisor is modulated by a modulating data input;
a phase comparator that compares the feedback clock to a reference clock to generate a phase-compare result;
a loop filter generating a loop voltage;
a charge pump that charges and discharges the loop filter in response to the phase-compare result;
a switch that connects the loop voltage to the VCO analog input during a normal mode of operation, and connects a reference voltage to the VCO analog input during a calibration mode;
a clock counter that receives the VCO output and generates a count difference value;
a Digital-to-Analog Converter (DAC) that receives the modulating data input and a calibration input and generates an analog voltage to the gain modulation input of the VCO;
a Look-Up Table storing calibration values that are applied to the calibration input of the DAC in response to the count difference value; and
a state machine that forces the modulating data input to a minimum state for a first measurement period of time and to a maximum state for a second measurement period of time;
wherein the clock counter counts pulses of the VCO output during the first and second measurement periods of time and generates the count difference value as a difference in a first count during the first measurement period of time and a second count during the second measurement period of time;
wherein the count difference value is applied to the Look-Up Table to read a calibration value that is applied to the calibration input of the DAC during the normal mode to compensate the VCO.

14. The two-point modulation PLL of claim 13 wherein the clock counter further comprises:
a fast divider that receives the VCO output and generates a divided signal having a reduced frequency than the VCO output; and
a divided clock counter that counts the divided signal from the fast divider to generate a measured count value.

15. The two-point modulation PLL of claim 14 wherein the Look-Up Table has rows that are addressed by the count difference value, the rows each storing a DAC reference value for output;
wherein division and multiplication are not performed during calibration but are pre-computed into the Look-Up Table.

16. The two-point modulation PLL of claim 14 wherein the Look-Up Table comprises pre-computed values of the calibration values as a function of the count difference value, wherein the calibration value is:

$$SFD/[[(Fref \times K/Ntimes) \times (\text{Count Mod 1} - \text{Count Mod 2})]/(DACREFinitial)];$$

wherein SFD is a specified frequency deviation in Hertz;
Fref is a reference frequency of the reference clock in Hertz;
Ntimes is number of cycles of Fref;
Count Mod 1−Count Mod 2 is the count difference value;
DACREFinitial is an initial value of the calibration value; and
K is a divisor for the fast divider that is 1 or more.

17. The two-point modulation PLL of claim 16 wherein the state machine applies the initial value of the calibration value to the DAC during calibration;
wherein the initial value of the calibration value is half of a range of possible values of the calibration value.

18. A calibrating Phase-Locked Loop (PLL) modulator comprising:
phase compare means for comparing a feedback clock to a reference clock to generate a phase-compare result;
loop filter means for generating a loop voltage;

charge pump means for charging and discharging the loop filter means in response to the phase-compare result;

switch means for connecting the loop voltage to a voltage-controlled oscillator (VCO) analog input during a normal mode of operation, and for connecting a reference voltage to a VCO analog input during a calibration mode;

feedback divider means for generating a feedback clock by dividing a VCO output by a divisor, and for modulating the divisor in response to a modulating data input;

voltage-controlled oscillator (VCO) means for generating the VCO output having a frequency determined by the VCO analog input and by a second input;

clock counter means for counting pulses of the VCO output and for generating a count difference value;

Digital-to-Analog Converter (DAC) means for generating an analog voltage to the second input of the VCO means by converting digital values of the modulating data input adjusted by a digital calibration input;

Look-Up Table means for storing calibration values that are applied to the digital calibration input of the DAC means in response to the count difference value; and control means for forcing the modulating data input to a minimum state for a first measurement period of time and for forcing the modulating data input to a maximum state for a second measurement period of time;

the clock counter means further for counting pulses of the VCO output during the first and second measurement periods of time and for generating the count difference value as a difference in a first count during the first measurement period of time and a second count during the second measurement period of time;

wherein the count difference value is applied to the Look-Up Table means to read a calibration value that is applied to the digital calibration input of the DAC means during the normal mode to compensate the VCO means.

19. The calibrating PLL modulator of claim 18 wherein the clock counter means further comprises:

fast divider means, receiving the VCO output, for generating a divided signal having a reduced frequency than the VCO output;

clock count means for counting the divided signal from the fast divider means to generate the count difference value.

20. The calibrating Phase-Locked Loop (PLL) modulator of claim 19 further comprising:

sigma-delta modulator means, coupled to the feedback divider means, for dithering two or more integer divisors to apply to the feedback divider means;

summer means, receiving the modulating data input and a channel select signal, for generating a modulating signal to the sigma-delta modulator means;

wherein data modulation is injected at the feedback divider means and at the second input of the VCO means, wherein the calibrating PLL modulator is a two-point modulation Phase-Locked Loop (PLL).

* * * * *